US007989705B2

(12) United States Patent
Pawel

(10) Patent No.: US 7,989,705 B2
(45) Date of Patent: Aug. 2, 2011

(54) CIRCUIT CARD AND METHOD FOR INCREASING THE RESISTANCE OF A CIRCUIT CARD TO THE FORMATION OF CONDUCTIVE FILAMENTS

(75) Inventor: Sascha Pawel, Biel (CH)

(73) Assignee: CT-Concept Holding AG, Biel (CH)

( * ) Notice: Subject to any disclaimer, the term of this patent is extended or adjusted under 35 U.S.C. 154(b) by 380 days.

(21) Appl. No.: 12/210,688

(22) Filed: Sep. 15, 2008

(65) Prior Publication Data

US 2009/0071694 A1 Mar. 19, 2009

(30) Foreign Application Priority Data

Sep. 18, 2007 (CH) ........................................ 1454/07

(51) Int. Cl.
*H05K 1/00* (2006.01)

(52) U.S. Cl. ........................................ 174/250; 174/260

(58) Field of Classification Search .................. 174/250, 174/262; 29/846, 592.1; 257/759, 758, 760; 442/237, 181, 59
See application file for complete search history.

(56) References Cited

U.S. PATENT DOCUMENTS

| 5,981,880 | A | 11/1999 | Appelt et al. | |
|---|---|---|---|---|
| 6,944,946 | B2 * | 9/2005 | Japp et al. | 29/852 |
| 2002/0123285 | A1 | 9/2002 | Dana | |
| 2003/0196749 | A1 | 10/2003 | Japp et al. | |
| 2006/0170058 | A1 * | 8/2006 | Chiang et al. | 257/369 |
| 2008/0164057 | A1 | 7/2008 | Mori et al. | |
| 2009/0151989 | A1 * | 6/2009 | Hunrath | 174/257 |
| 2010/0294740 | A1 * | 11/2010 | Cheng et al. | 216/18 |

FOREIGN PATENT DOCUMENTS

EP 1 653 789 A1 5/2006
* cited by examiner

*Primary Examiner* — Yuriy Semenenko
(74) *Attorney, Agent, or Firm* — Kenyon & Kenyon LLP

(57) ABSTRACT

The present invention relates to a circuit card (4.3; 4.4) which includes conductive patterns (1, 2, 5, 6) and a web (3) made of glass fibers, at least one non-conductive blocking element (11.1; 11.2) for blocking the growth of a conductive filament (12.1; 12.2) along a glass fiber is provided which connects a conductive pattern (1, 2) with a further conductive pattern (5, 6). The present invention also relates to a method for increasing the resistivity of a circuit card (4.3; 4.4) to the formation of conductive filaments (12.1; 12.2), the circuit card (4.3; 4.4) including conductive patterns (1, 2, 5, 6) and a web (3) made of glass fibers; the circuit card (4.3; 4.4) being provided with at least one non-conductive blocking element (11.1; 11.2) for blocking the growth of a conductive filament (12.1; 12.2) along a glass fiber, which connects a conductive pattern (1, 2) to a further conductive pattern (5, 6).

9 Claims, 2 Drawing Sheets

CIRCUIT CARD AND METHOD FOR INCREASING THE RESISTANCE OF A CIRCUIT CARD TO THE FORMATION OF CONDUCTIVE FILAMENTS

REFERENCE TO RELATED APPLICATIONS

This Application claims the priority of Swiss Patent Application 1454/07, filed on Sep. 18, 2007, and whose entire disclosure is referenced hereby.

BACKGROUND

The present invention relates to a circuit card according to the definition of the species in claim 1, and a method for increasing the resistivity of a circuit card to the formation of conductive filaments according to the definition of the species in claim 13.

BACKGROUND INFORMATION

Circuit cards are usually made up in predominant part of glass fiber-reinforced synthetic resins. The glass fiber-reinforced synthetic resins form a carrier structure onto which planar conductors are applied. This construction repeats in several layers, one on top of the other. In order to connect the conductors situated in the different layers, contact holes are inserted, which push through either a part of the layers or the entire circuit card.

Within a circuit card, growth of conductive filaments (conductive anodic filament, CAF) may occur. A conductive filament is typically made up of deposited metal connections or deposited metal, and its length shortens the remaining path of a first conductive pattern (for instance, a conductor, a contact hole) at a first electric potential to a second, adjacent conductive pattern that is at a second electric potential.

This is shown schematically in FIG. 1. FIG. 1 shows a partial cutout of a circuit card 4.1 made of glass fiber-reinforced synthetic resin 3 (synthetic resin-glass fiber web), which has a first conductor 2 having contact holes 1 at a first potential, and a second conductor 6 having contact holes 5 at a second potential. From first conductor 2 and especially from its contact holes 1, conductive filaments 7 are able to grow in the direction towards second conductor 6 or its contact holes 5, or vice versa, depending on the direction of the potential gradient. As soon as a filament, or filaments 7, reach second conductor 6 or one of its contact holes 5, this leads to a strong influencing of the insulation between the two conductive patterns formed by conductors 2, 6 and their contact holes 1, 5, which may result in the functional failure of circuit card 4.1.

The conductive filaments spread typically, but not exclusively, along individual glass fibers or glass fiber bundles (cf. D. J. Lando, J. P. Mitchell, T. L. Welsher, "Conductive Anodic Filaments in Reinforces polymeric Dielectrics: Formation and Prevention", International Reliability Physics Symposium, 1975, pp. 51-63, K. Rogers, C. Hillmann, M. Pecht, "Conductive Filament Formation Failure in a Printed Circuit Board", Circuit World, Vol. 25, 1999, pp. 6-8, A. Brewin, L. Zou, C. Hunt, "Susceptibility of Glass-Reinforced Epoxy Laminates to Conductive Anodic Filamentation", National Physical Laboratory (NPL) Report MATC(A)155, September 2004, ISSN 1473 2734).

The phenomenon designated here as a filament differs from phenomena occurring purely at the surface of a circuit card (B. Rudra, M. Pecht, D. Jennings, "Assessing Time-to-Failure due to Conductive Filament Formation in Multilayer Organic Laminates", IEEE Transactions on Components, Packaging and Manufacturing Techniques—Part B, Vol. 17, No. 3, August 1994, pp. 269-276, A. Brewin, L. Zou, C. Hunt, "Susceptibility of Glass-Reinforced Epoxy Laminates to Conductive Anodic Filamentation", National Physical Laboratory (NPL) Report MATC(A)155, September 2004, ISSN 1473 2734). Thus, in particular, the purely chemical partial dissolving of conductor metal (so-called tarnish creepage) is not involved, and also not so-called whisker growth, which is primarily caused by mechanical stress.

The mechanism of formation or growth of the conductive filaments is understood to be an electrochemical reaction which is transmitted via aqueous components in the synthetic resin and/or especially via absorbed aqueous layers on the surface of the glass fibers (B. Rudra, M. Pecht, D. Jennings, "Assessing Time-to-Failure due to Conductive Filament Formation in Multilayer Organic Laminates", IEEE Transactions on Components, Packaging and Manufacturing Techniques—Part B, Vol. 17, No. 3, August 1994, pp. 269-276). The mechanism of formation or growth may be regarded as electrolytic corrosion, and is therefore favored by high electrical field strengths. Furthermore it is known that components of chemical auxiliary substances and functional substances in the circuit card production are able to favor the formation of filaments (W. J. Ready, L. J. Turbini, "A Combination of Hourly Versus Daily Testing Methods for Evaluating the Reliability of Water Soluble Fluxes", IEEE Trans. On Advanced Packaging, Vol. 23, No. 2, May 2000, W. J. Ready, L. J. Turbini, S. R. Stock, B. A. Smith, "Conductive Anodic Filament Enhancement in the Presence of a Polyglycol-Containing Flux", IEEE Reliability Physics Symposium, 1996, pp. 267-273). Different chemical compositions of the synthetic resin component of the circuit card may lead to an influencing of the growth rate of the filaments.

One may generally assume that the formation of the conductive filaments involves essentially a two-step process: In a first phase, the boundary between the reinforcing glass fibers of the circuit card and the synthetic resin surrounding the glass fibers changes. The change is such that the bonding between the synthetic resin and the glass fiber is diminished, and water as well as ionic reaction components are able to be attached to the glass fiber surface as aqueous solution. If hollow fibers are present in the circuit card material, this represents a special case. Hollow glass fibers do not have synthetic resin on their inside. That is why, for this case, the first phase is, so to speak, closed from the start (M. Pecht, C. Hillman, K. Rogers, D. Jennings, "Conductive Filament Formation: A Potential Reliability Issue in Laminated Printed Circuit Cards with Hollow Fibers", IEEE Trans. On Electronics Packaging Manufacturing, Vol. 22, No. 1, January 1999, pp. 80-84, K. Rogers, C. Hillmann, M. Pecht, "Hollow Fibers Can Accelerate Conductive Filament Formation", ASM International Practical Failure Analysis, Vol. 1, Issue 4, August 2001, pp. 57-60). In particular, when a contact hole cuts through such a hollow glass fiber, the formation of conductive filaments is highly likely.

In a second phase the transport of metal or metal ions (generally of copper salts, possibly of copper complexes, in the case of copper-containing conductors or contact holes) takes place between two points of different potential, for example between two conductors or their contact holes. This metal transport brings about the formation of the conductive filaments. In addition, the gradient of the pH value of the aqueous solution attaching to the glass fibers acts in a mediating way for the process of the metal transport (D. J. Lando, J. P. Mitchell, T. L. Welsher, "Conductive Anodic Filaments in Reinforced Polymeric Dielectrics: Formation and Prevention", International Reliability Physics Symposium, 1975, pp. 51-63, B. Rudra, D. Jennings, "Tutorial Failure-Mechanism Models for Conductive-Filament Formation", IEEE Transactions on Reliability, Vol. 43, No. 3, September 1994, pp. 354-360, A. Brewin, L. Zou, C. Hunt, "Susceptibility of Glass-Reinforced Epoxy Laminates to Conductive Anodic Filamentation", National Physical Laboratory (NPL) Report MATC(A)155, September 2004, ISSN 1473 2734).

Several conceptually different approaches are known for counteracting the phenomenon of the formation of conductive filaments.

By one suitable treatment and or coating of the surface of the glass fibers in the circuit card material, the bonding strength between synthetic resin and glass fiber may be increased, so that the first phase described above, of filament formation may be impeded (cf. WO0224592, JP9012343, US2007141268, US5585147, JP7279055).

In one known possibility of reducing the growth rate or the speed of growth of the filaments, the moisture content of the entire circuit card is lowered, or rather, of the further taking up by the circuit card of moisture from the environment is impeded (cf. M. G. Pecht, H. Ardebili, A. A. Shukla, J. K. Hagge, D. Jennings, "Moisture Ingress Into Organic Laminates", IEEE Trans. on Components and Packaging Technology, Vol. 22, No. 1, March 1999, pp. 104-110, US6944946, JP2005101362).

Furthermore, circuit card materials exist that have a reduced number of hollow glass fibers (JP2004115368).

Some known successful approaches work with a specially adapted chemical composition of the synthetic resins used for the circuit cards and using a special processing of the synthetic resins (cf. B.-C. Wu, M. Pecht, D. Jennings, "Conductive Filament Formation in Printed Wiring Boards", IEEE International Electronics Manufacturing Technology Symposium, 1992, pp. 74-79, M. G. Pecht, H. Ardebili, A. A. Shukla, J. K. Hagge, D. Jennings, "Moisture Ingress Into Organic Laminates", IEEE Trans. on Components and Packaging Technology, Vol. 22, No. 1, March 1999, pp. 104-110, K. Nawa, M. Ohkita, "Reliability of the Laminate from Advanced COPNA-Resin/E-Glass Fabrics System", IEEE Trans. on Components and Packaging Technology—Part B, Vol. 20, No. 1, February 1997, pp. 78-86, TW591989B, JP2000183470, JP2004149577, JP8151458).

Moreover, attempts have been made concerning the avoidance of certain reaction-mediating substances, particularly halogen compounds, to lower the rate at which metal ions go into solution (TW261603B). The electrolytic reaction of filament formation depends on the rate at which the metal ions go into solution From JP5140419 it is known that one may diminish the quantity of metal ions in solution that are capable of reacting by ion exchange within the synthetic resin matrix of the circuit card.

The first phase in the formation of a conductive filament, in which the bonding between glass fiber and synthetic resin surrounding the glass fiber is lowered, occurs all the more markedly the more the natural weak spots in this bonding are present right from the start. In JP2006232951 a method is described for reducing such weak spots.

Contact holes that are formed by metallized bores in the circuit card material are usually particularly prone to the formation of conductive filaments. JP2001177247 describes a contact hole construction which is supposed to lead to a delay in the first phase in the formation of conductive filaments. In this instance, the contact hole is coated with a suitable material after the bore is produced, and before the metallization. As a result, the glass fiber/synthetic resin regions that are potentially damaged during boring do not come into contact with the metal, so that the formation of an electrochemical cell, and thereby a conductive filament, is counteracted.

In the usual way, the glass fibers or glass fiber bundles of the circuit card material are each woven at right angles to one another in a grid or a matrix. The filament growth typically takes place along the glass fibers. To avoid impairing the insulation between two conductor structures of different electric potential, the second conductor structure may be shifted with respect to the orthogonal grid. This is shown schematically in FIG. 2, in which the terms "horizontal" and "vertical" refer to the image plane in reference to FIG. 2.

FIG. 2 shows a partial cutout of a circuit card 4.2 having a synthetic resin-glass fiber web 3 and having a first conductor 2 having contact holes 1 at a first potential and a second conductor 6 having contact holes 5 at a second potential, conductor 6 having contact holes 5 running parallel to conductor 2 having contact holes 1 and being aligned to it horizontally. That is, contact holes 1, 5 and conductors 2, 6 are not shifted horizontally with respect to each other. Furthermore, conductors 2, 6 and contact holes 1, 5 are aligned on the matrix (indicated by the checked representation of circuit card 4.2) that is formed by the intertwined glass fibers of circuit card 4.2. A conductive filaments 7 is shown which connects to one another contact holes 1, 5 that are horizontally aligned, the respective radii of contact holes 1, 5 shortening the length of filament 7. A very likely course of a filament 7 is shown.

Circuit card 4.2 has a third conductor 8 having contact holes 9, at a third potential, which is horizontally shifted with respect to conductors 2, 6 and their contact holes 1, 5. Contact holes 9 of third conductor 8 are not horizontally aligned with contact holes 1, 5 of conductors 2, 6, but, as seen horizontally, they are located between two contact holes 1 and 5. Conductor 8 is also not aligned with conductors 2, 6. Contact holes 9 are shifted by 45° with respect to contact holes 5, this being in reference to the coordinate system formed by the glass fiber matrix. The shifting of third conductor 8 and its contact holes 9 with respect to conductors 2, 6 and their contact holes 1, 5, results in a longer filament 10, again a very probable course being shown of a filament 10 that is being formed. Thus, the path of the filament formation becomes longer because of the shifting, so that the insulation between conductor 8 having contact holes 9, and the further conductor structures remains unimpaired by the filament formation, for a longer period of time.

In the case of circuit cards intended for higher voltages, it is customary to lay out the insulating synthetic resin-glass fiber web layers between conductor planes of different electric potential in multiple fashion. By doing this, the influence of weak spots in each individual one of the synthetic resin-glass fiber web layers on the overall insulation is reduced.

In addition, conductor structures that are to be insulated, for instance conductors, are frequently positioned in different conductive pattern planes or conductor planes. The horizontal insulation that would possibly be threatened by the formation of conductive filaments is replaced, in this instance, by a more resistant vertical insulation. "Horizontal", in this case, means within a conductive pattern plane, while "vertical" means perpendicular the respective conductive pattern planes. Because of this, the resistance or the resistivity with respect to the formation of conductive filaments may be increased by additional synthetic resin-glass fiber web layers, at the expense of production costs as well as the final level/strength of the circuit card.

Thus, it is known from JP3076297 that, between two conductor planes or conductor layers, one may process a plurality of individual layers of glass fiber web mats (so called prepregs) one on top of the other. This lowers the probability that a conductive filament might grow from a first conductor plane to a second conductor plane, through the insulating synthetic resin-soaked glass fiber web, along one or more glass fiber sections.

DETAILED DESCRIPTION OF THE PRESENT INVENTION

It is the object of the present invention to create a circuit card which has a high resistivity or resistance to the formation of conductive filaments (conductive anodic filaments, CAF) on the inside, particularly on their inner layers. It is furthermore the object of the present invention to provide a method for increasing the resistivity of a circuit card to the formation of such conductive filaments. The circuit card according to the present invention should be implementable as a circuit card having planar coils and transformers.

This object is attained by a circuit card having the features of claim 1 and by a method for increasing the resistivity of a circuit card to the formation of conductive filaments having the features of claim 13.

The circuit card according to the present invention includes conductive patterns and a web made of glass fibers, and is characterized in that at least one nonconductive, or rather, insulating blocking element, for blocking the growth of a conductive filament along a glass fiber, is provided, which connects one conductive pattern to a further conductive pattern. The blocking element preferably interrupts the glass fiber. By circuit card one may also understand a printed circuit card or a printed circuit board, and also a circuit card part, circuit card section or circuit card cutout. The conductive patterns are, for instance, conductors and contact holes connecting the conductors, which may be metallized. By glass fiber one may also understand a glass fiber bundle. The web made of glass fibers may also be designated as a matrix of glass fibers, the web typically being formed by warp and filling threads made of glass fibers.

The blocking element is preferably situated spatially near a conductive pattern that has an electrically positive potential particularly with respect to an additional conductive pattern.

The blocking element preferably has a hole, which may also be designated as blocking hole, and which has been particularly executed as a bore hole, that is, by a boring process in the circuit card. The hole may be compactly backfilled or filled. The hole is not metallized.

According to one preferred exemplary embodiment of the circuit card according to the present invention, the blocking element is developed as a hole or blocking hole, whose diameter is greater than the diameter of a contact hole of a conductive pattern to which a blocking hole is allocated. This ensures that the hole blocks the growth of a conductive filament along a glass fiber, which grows starting from the contact hole.

According to a further preferred exemplary embodiment of the circuit card according to the present invention, the blocking element includes a plurality of holes or blocking holes situated at a distance from one another, which are positioned at a depth or staggered depth of at least two rows, at least partially, around a conductive pattern of the circuit card, for instance, around a contact hole. In this exemplary embodiment, the holes of different rows are preferably situated offset, or they overlap, so that a glass fiber, which starts from the conductive pattern, is interrupted by the holes. The diameter of the holes may then be smaller than, or equal to the diameter of a contact hole, in order to block the growth of a conductive filament, starting from a contact hole and through the blocking element.

The method according to the present invention, for increasing the resistivity of a circuit card to the formation of conductive filaments, are characterized in that the circuit card is provided with at least one blocking element which blocks the growth of a conductive filament along a glass fiber that connects one conductive pattern to another conductive pattern, the blocking element being especially situated so that it interrupts the glass fiber. The circuit card is provided with a blocking element preferably by introducing at least one hole, which may also be designated as a blocking hole, into the circuit card, the hole preferably being introduced into the circuit card by boring. The hole may be compactly backfilled or filled. Metallization of the hole does not take place, as opposed to the usual procedure in the case of a contact hole.

According to one preferred specific embodiment of the method according to the present invention, a plurality of holes, that are at a distance from one another, is introduced into the circuit card, the plurality of holes being situated at a depth of at least two rows at least partially around a conductive pattern, for instance, around a contact hole. The holes of different rows are preferably situated offset or overlapping, so that it is ensured that a glass fiber that starts from the conductive pattern, or a filament that is forming along such a glass fiber, is interrupted by the holes.

The manner in which the conductive filaments (conductive anodic filaments, CAF) form, conditions that the conductive filaments, above all, spread out or grow along glass fibers of a circuit card or of the circuit card material. On the other hand, if a conductive filament attempts to spread out, away from a glass fiber, through the massive synthetic resin in which the glass fiber web of the circuit card has typically been soaked, this synthetic resin impedes the further growth of the filament.

Using the approach according to the present invention, the direct formation path of conductive filaments along glass fibers may be blocked, so that the conductive filaments have to transit to other glass fibers in order to grow, but they are hindered in doing this by the synthetic resin located between the glass fibers. This is achieved by the blocking elements introduced into the circuit card, which are preferably developed as one or more holes in the form of bore holes. These blocking elements interrupt at least a glass fiber that is growing from one conductive pattern that is at a certain electric potential to a conductive pattern having a lower electric potential, so that a conductive filament is not able to grow further along this glass fiber. In this way, in an advantageous manner, critical or particularly endangered conductive patterns, such as metallized contact holes (through contactings), or so-called buried through contactings on the inner layers of a circuit card, may be protected from conductive filaments, starting from them, growing to a conductive pattern that is at a lower electric potential. Conductive patterns are regarded as critical or as particularly endangered conductive patterns which are particularly suitable for conductive filaments forming by starting from them.

In particular, in the case of blocking elements developed as holes, the resistivity of the circuit card to the formation of conductive filaments in relation to the mechanical stability of the circuit card may be optimized by a suitable selection of the diameter and the number of the holes. The blocking elements preferably do not go over into one another, and are preferably also situated at a distance from the conductive patterns, especially from contact holes of the conductive patterns, which, especially in a development of the blocking elements as holes, is advantageous for the mechanical stability of the circuit card. In the case of blocking elements that are developed as holes, a slight increase in the superficial leakage path may occur.

The design approach according to the present invention may be used as early as in the design phase of a circuit card, so that the design approach according to the present invention makes no demands on the usual production process of circuit cards, or rather, the introduction of additional process steps during production is not necessary. The designer/developer of a circuit card will be able to implement the design approach according to the present invention without assistance. Furthermore, the design approach according to the present invention is not dependent upon the producer, and has basically no disadvantages with respect to conventional circuit components that are present on a circuit card.

BRIEF DESCRIPTION OF THE DRAWINGS

Further advantageous embodiments of the present invention are yielded by the dependent claims and by the exemplary embodiments shown below with the aid of the drawings. The figures show:

In the figures, like reference numerals designate structurally or functionally like or functionally equivalent components. FIGS. 1 and 2 have already been described in the specification introduction, and we refer to the text there.

MANNER OF IMPLEMENTING THE PRESENT INVENTION

Figure 1:
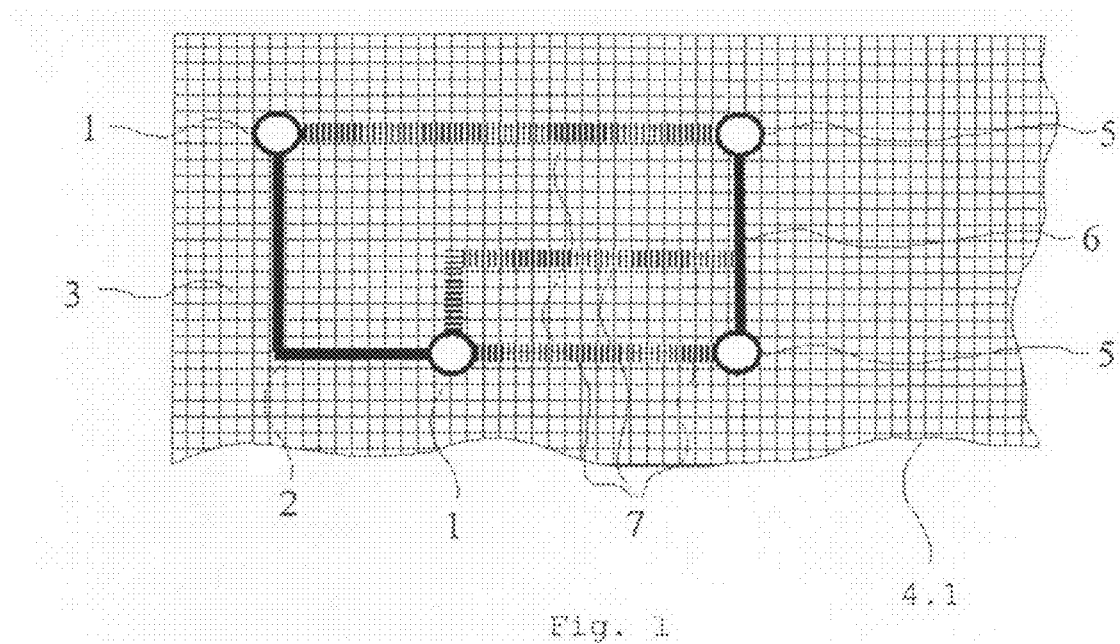
FIG. 1 a schematic representation partial cutout of a circuit card having conductive filaments, FIG. 2 a schematic representation of a partial cutout of a circuit card in which the conductive patterns are situated in a known manner in such a way that the formation of conductive filaments is impeded, FIG. 3 a schematic representation of a first exemplary embodiment of a circuit card according to the present invention, and FIG. 4 a schematic representation of a second exemplary embodiment of a circuit card according to the present invention.
Figure 2:
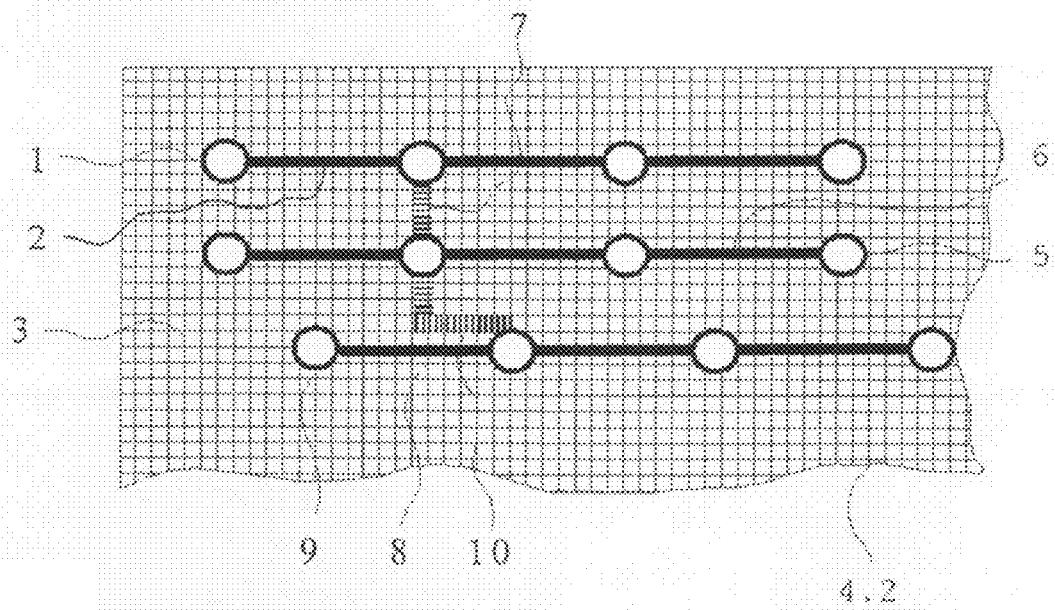
Figure 3:
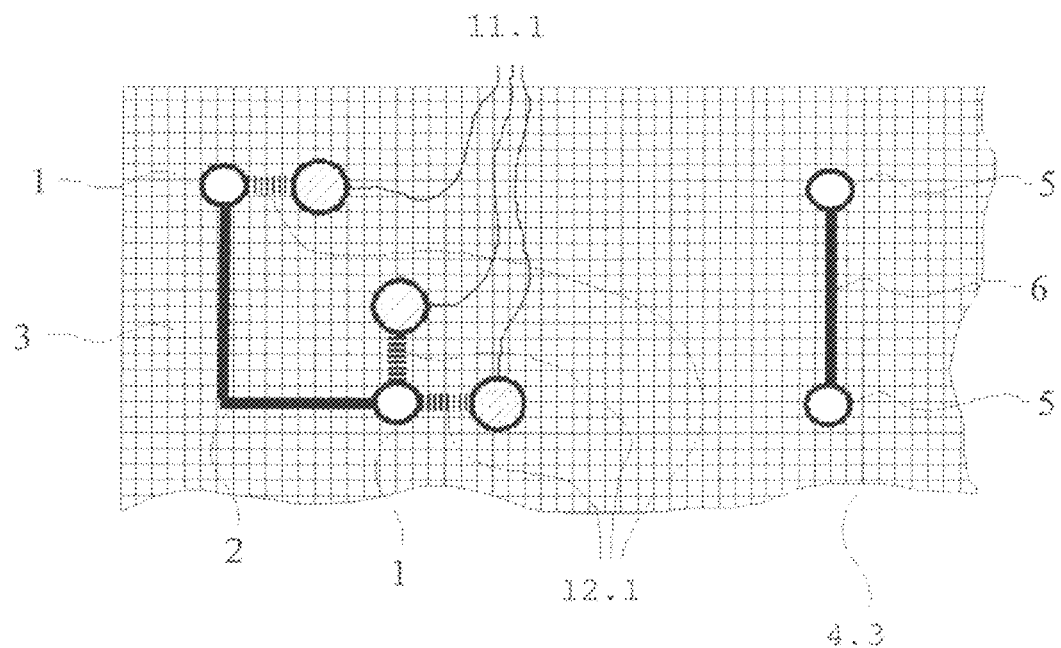

FIG. 3 shows a first exemplary embodiment 4.3 of a circuit card (or rather a partial cutout of such a card) according to the present invention, made of glass fiber-reinforced synthetic resin 3 (synthetic resin-glass fiber web or synthetic resin-glass fiber matrix), which corresponds to the partial cutout 4.1 of a circuit card shown in FIG. 1 except for additional blocking elements 11.1 and the course of conductive filaments 12.1. A first conductive pattern, not designated in greater detail, having a first conductor 2 and having contact holes 1 at a first electric potential, and a second conductive pattern, not designated in greater detail, having a second conductor 6 and having contact holes 5 at a second, lower electric potential, are provided. The glass fibers are situated in the form of a web or a matrix 3, which is soaked in synthetic resin, the glass fiber web being typically formed of glass fiber warp and filling threads, which is symbolized in FIGS. 1 through 4 by the checkered representation of circuit cards 4.1-4.4.

Furthermore, in circuit card 4.3, according to the present invention, blocking elements 11.1 in the form of holes, especially bore holes are provided in the vicinity of the first conductive pattern, particularly in the vicinity of their contact holes 1, which, for instance, are regarded as being particularly endangered conductive patterns. Blocking elements 11.1 are situated in the direction of the nearest, second conductive pattern having conductor 6 and contact holes 5, which has a lower electric potential than the first conductive pattern.

At least one blocking element 11.1 is allocated to each contact hole 1, each blocking element 11.1 being formed by exactly one hole, and it has a larger diameter than contact hole 1 to which it is assigned. In this way, the direct path of formation of a conductive filaments 12.1, starting from contact hole 1 and going along a glass fiber which runs in the direction of a warp thread or a filling thread, or forms such a thread, is interrupted, and conductive filaments 12.1 is not able to grow further, at least in this direction, and leads to a connection to conductor 6 or one of contact holes 5, and thus to a breakdown in the insulation between the first conductive pattern and the second conductive pattern.

Blocking elements 11.1 are preferably situated in the direction of the warp threads and/or the filling threads of synthetic resin-glass fiber web 3, so that, in these directions in each case, an interruption of a glass fiber takes place. To lower contact hole 1, as seen by the viewer, one blocking element 11.1 is allocated in the direction of the warp thread and one blocking element 11.1 is allocated in the direction of the filling thread of synthetic resin-glass fiber web 3. To upper contact hole 1, as seen by the viewer, only one blocking element 11.1 needs to be allocated in the direction of the warp thread, since no further conductive patterns are provided above this contact hole. Thus, starting from a particularly endangered conductive pattern, basically no blocking elements 11.1 need to be provided in those directions in which an additional conductive pattern occurs only at a great distance.

Figure 4:
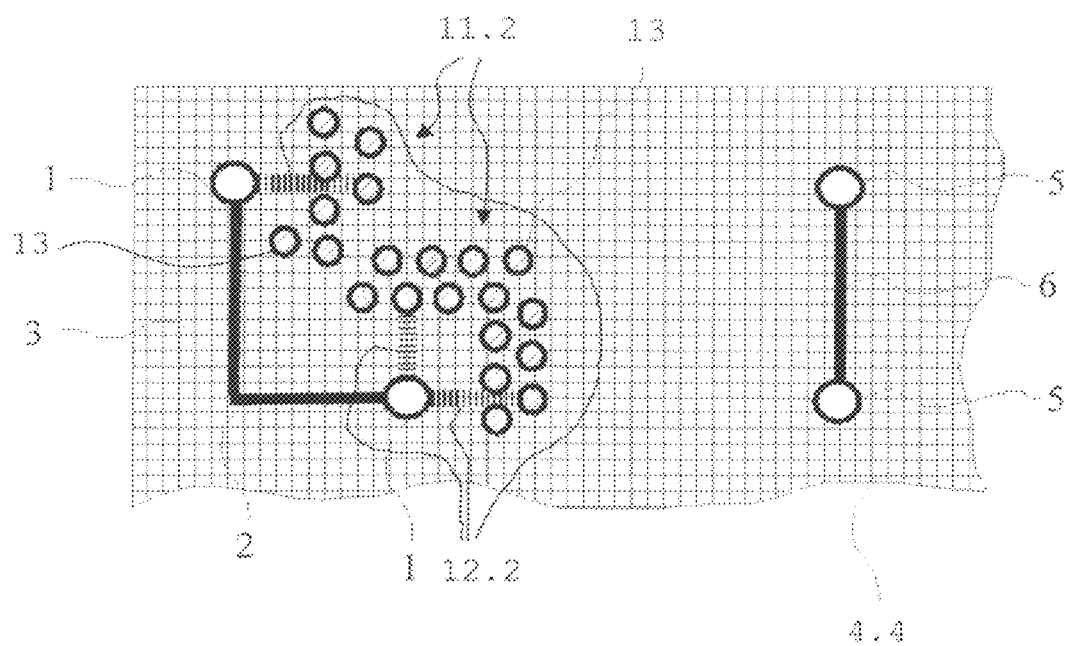

FIG. 4 shows a second exemplary embodiment 4.4 of a circuit card (or rather a partial cutout of such a card) according to the present invention, made of glass fiber-reinforced synthetic resin 3 (synthetic resin-glass fiber web or synthetic resin-glass fiber matrix), which corresponds to exemplary embodiment 4.3, shown in FIG. 3, except for the embodiment of blocking elements 11.1 and the course of the conductive filaments.

Around, or rather in the surroundings of each conductive pattern, classified as being particularly endangered, which is at a higher potential compared to the additional conductive patterns, this means, for instance, a blocking element 11.2 is situated to contact holes 1 of the first conductive pattern which preferably crosses a warp thread starting from respective contact hole 1 and a filling thread starting from respective contact hole 1 of synthetic resin-glass fiber web 3, and extends in the direction towards the second conductive filaments pattern having conductor 6 and contact holes 5. However, in the case of blocking element 11.2, which is allocated to contact hole 1 that is situated further up as seen by the viewer, one may do without the crossing of the filling thread running through this contact hole 1 by blocking element 11.2, since, for example, above this contact hole 1, no further conductive patterns at a lower potential are provided.

Each blocking element 11.2 includes a plurality of holes 13, that are at a distance from one another, which surround the respective contact hole 1, for example, at a staggered depth of two rows, the rows being able to be designed to be curved or bent, so that they partially run around respective contact hole 5 [sic; 1]. The diameter of holes 13 is less than, or equal to the diameter of contact holes 1. The rows of holes 13 overlap in such a way, or are situated offset to one another in such a way, that a glass fiber starting from a contact hole 1 and going in the direction towards the second conductive pattern is interrupted by holes 13.

If holes 13 of blocking elements 11.2 are selected so that they have the same diameter among themselves, the distance apart of the centers of holes 13 arranged in a row is preferably less than twice the diameter of these holes 13.

If at least some of holes 13, if not even all holes 13, have different diameters, the distance apart of the centers of holes 13 arranged in a row is preferably less than twice the diameter of the hole 13 that has the largest diameter.

The path of formation of conductive filaments 12.2 along glass fibers in the direction of an additional conductive pattern that is at a lower electric potential is advantageously able to be interrupted by blocking elements 11.2

While preferred embodiments of the present invention are described in the present Application, we should clearly point out that the present invention is not limited to these, but is also able to be carried out in other ways, within the scope of the following claims.

What is claimed is:

1. A circuit card including conductive patterns and a web made of glass fibers, wherein at least one non-conductive blocking element for blocking the growth of a conductive filament along a glass fiber is provided, which connects a first conductive pattern to a second conductive pattern, wherein the blocking element interrupts the glass fiber and includes a plurality of holes that are situated at a distance from one another, the holes form at least two rows and the at least two rows of holes are distributed at least partially around the first conductive pattern.

2. The circuit card as recited in claim 1, wherein the blocking element is situated near the first conductive pattern.

3. The circuit card as recited in claim 2, wherein the blocking element is situated near the first conductive pattern which has an electrically positive potential with respect to the second conductive pattern.

4. The circuit card as recited in claim 1, wherein the blocking element includes particularly a bore hole.

5. The circuit card as recited in claim 4, wherein the at least one hole is compactly backfilled.

6. The circuit card as recited in claim 1, wherein the holes of different rows are situated offset in such a way that a glass fiber is interrupted by the holes.

7. The circuit card as recited in claim 6, wherein the diameter of the holes is less than, or equal to the diameter of a contact hole of the first conductive pattern.

8. The circuit card as recited in claim 7, wherein the holes have the same diameter, and the distance apart of the centers of the holes that are arranged in a row is less than twice the diameter of these holes.

9. The circuit card as recited in claim 7, wherein at least some of the holes have different diameters, and the distance apart of the centers of the holes that are arranged in a row is less than twice the diameter of the hole that has the largest diameter.

* * * * *